(12) United States Patent
Fitzsimmons et al.

(10) Patent No.: US 7,073,702 B2
(45) Date of Patent: Jul. 11, 2006

(54) SELF-LOCKING WIRE BOND STRUCTURE AND METHOD OF MAKING THE SAME

(75) Inventors: John A Fitzsimmons, Poughkeepsie, NY (US); Jeffrey P Gambino, Westford, VT (US); Anthony K Stamper, Williston, VT (US)

(73) Assignee: International Business Machines Corporation, Armonk, NY (US)

( * ) Notice: Subject to any disclaimer, the term of this patent is extended or adjusted under 35 U.S.C. 154(b) by 146 days.

(21) Appl. No.: 10/688,387

(22) Filed: Oct. 17, 2003

(65) Prior Publication Data

US 2005/0082347 A1    Apr. 21, 2005

(51) Int. Cl.
B23K 31/02    (2006.01)
B23K 31/00    (2006.01)
H01L 23/52    (2006.01)

(52) U.S. Cl. .................. 228/180.5; 228/4.5; 257/784
(58) Field of Classification Search .................. None
See application file for complete search history.

(56) References Cited

U.S. PATENT DOCUMENTS

| | | | |
|---|---|---|---|
| 3,101,523 A * | 8/1963 | Henneke | 29/860 |
| 5,235,212 A | 8/1993 | Shimizu et al. | |
| 5,298,793 A | 3/1994 | Kotani et al. | |
| 5,550,083 A * | 8/1996 | Koide et al. | 438/4 |
| 5,626,276 A | 5/1997 | Lo et al. | |
| 5,775,567 A | 7/1998 | Lo et al. | |
| 5,817,540 A | 10/1998 | Wark | |
| 6,060,769 A | 5/2000 | Wark | |
| 6,281,046 B1 | 8/2001 | Lam | |
| 6,376,914 B1 | 4/2002 | Kovats et al. | |
| 6,388,335 B1 | 5/2002 | Lam | |
| 6,413,799 B1 | 7/2002 | Lam | |
| 6,614,249 B1 | 9/2003 | Farnworth et al. | |
| 2001/0003375 A1 | 6/2001 | Kovats et al. | |
| 2002/0177296 A1 | 11/2002 | Ball | |
| 2005/0112861 A1 * | 5/2005 | Fitzsimmons et al. | 438/617 |

* cited by examiner

*Primary Examiner*—Lynne R. Edmondson
(74) *Attorney, Agent, or Firm*—DeLio & Peterson, LLC; Robert Curcio; Lisa U. Jaklitsch, Esq.

(57) ABSTRACT

A complimentary self-locking wire bond structure and technique is introduced, where the bonding force is focused at the tip of the bond wire and a barb-type construction is utilized to enhance the durability and reduce the insertion forces. The end of wire bond has an "arrowhead" or similar functioning fastener such that the force is focused to a point that pierces the bond pad in a local area. The bond pad may be self-healing, such that the bond pad is made to close over and seal or lock the barb into the underpad layer below the pad, while making electrical contact with the wire bond at the bond pad surface. The bond pad may have a cushioning layer or cavity below it to dampen the piercing force of the pointed barb. A thin metal pad may also be formed over the compliant underpad layer for force absorption.

12 Claims, 11 Drawing Sheets

SELF-LOCKING WIRE BOND STRUCTURE AND METHOD OF MAKING THE SAME

BACKGROUND OF THE INVENTION

1. Field of the Invention

The present invention relates to improved wire bonds and bond pads of semiconductor devices. More specifically, the present invention relates to a wire bond structure that provides a stronger attachment to a bond pad without introducing excessive force to the substrate during attachment, a bond pad with self-locking characteristics, and methods for making the same.

2. Description of Related Art

Semiconductor devices comprising semiconductor chips and lead frames are well known. A semiconductor chip having one or more semiconductor elements is generally mounted on a mounting area of a lead frame, and each region of the element, such as a transistor, wire, or passive device, and the like, is connected with a lead of the lead frame by a thin bonding wire typically of gold or aluminum. For connection with the bonding wire, each region of the semiconductor is provided with an electrode. In an integrated circuit chip, regions are usually connected to each other by interconnection on the chip, and for connection with a lead outside, a special part of the interconnection called a bond pad or electrode is prepared. Generally, a bonding wire is connected to the electrode or bond pad by means of thermocompression or thermosonic bonding. Usually, to carry out the bonding, a small ball is formed at the end of the bonding wire, and then pressed onto the electrode under high temperature while the wire is excited ultrasonically.

Bonding depends upon various conditions—mechanical pressure, temperature, strength of the electrode or bond pad, power of the ultrasonic wave, and time, among other factors. One type of failure is produced by the ball at the end of the bonding wire, which, being mechanically hard brings about structural deformation and destruction of the substrate upon compression. A typical method for bonding a thin metal wire by ultrasonic thermocompression bonding is the so-called on-element bonding. In this method, a thin metal wire is ultrasonically thermocompression-bonded to an electrode formed adjacent to an impurity region that is formed to constitute a functional element. This method, however, has problems in that distortions or cracks are generally produced in the electrode or substrate. As is presently known in the art, low-k dielectric materials are easily damaged during wire bond operations. Insertion of a wire bond may cause excessive forces that could otherwise distort, stress, or crack the pad and underlying substrate material. Furthermore, the strength of the bond is jeopardized if micro cracks are introduced during the bonding process.

In U.S. Pat. No. 5,550,083 issued to Koide et al., issued on Mar. 29, 1994, entitled "PROCESS OF WIREBOND PAD REPAIR AND REUSE," a wire bonding method is taught where wires are attached to pads, and subsequently disconnected for repair. A second pad is formed on the first pad, and a second wire is bonded to the second pad. The wire bond is attached by thermocompression, which can result in forces capable of causing distortion, stress, or cracks in the pad or underlying substrate.

In U.S. Patent Application Publication No. US2002/0177296 published on Nov. 28, 2002 by Ball, entitled "METHOD OF IMPROVING INTERCONNECT OF SEMICONDUCTOR DEVICES BY UTILIZING A FLATTENED BALL BOND," a method of forming a semiconductor device assembly having a wire bond is taught where one portion of the connecting structure is flattened prior to attachment. The flattened portion is created with additional force and power applied during the formation of the wire bond.

Bearing in mind the problems and deficiencies of the prior art, it is therefore an object of the present invention to provide a wire bond structure and method for making the same that can be formed without causing distortion, stress, or cracks in the pad or underlying substrate during formation.

It is another object of the present invention to provide a wire bond structure and method for making the same that provides for stronger bond retention without requiring excessive attachment force during formation.

Still other objects and advantages of the invention will in part be obvious and will in part be apparent from the specification.

SUMMARY OF THE INVENTION

The above and other objects, which will be apparent to those skilled in art, are achieved in the present invention which is directed to a wire bond apparatus for bonding wires to a semiconductor device having a top surface, the apparatus comprising: a wire having a barb at one end; a bond pad on the top surface of the semiconductor device; and an underpad layer beneath the bond pad to receive the barb inserted through the bond pad. The barb includes a pointed end, and flares outwards away from the wire, such that at least a portion of the barb is arrowhead shaped. The bond pad is made of a plurality of conductive materials including an intermediate layer for preventing intermetallic compounds from forming. The bond pad seals the barbed end when the barb is inserted through the bond pad. The bond pad may comprise a metal alloy, a ceramic, or a porous metal, such that metal can be rejoined to electrically connect the bond pad with the wire after the barb is inserted. The metal alloy may be vacuum welded to rejoin the bond pad with the wire. A cushioning layer or cavity within the underpad layer may be used to dampen a piercing force from the barb. The cushioning layer includes an elastic material, such as a polymer, SiLK®, a ceramic composition, a porous metal structure, or a soft metal. The outer diameter of the barb may be less than an outer diameter of the wire. Moreover, a shaft between the barb and the wire may attach the barb to the wire, the shaft being of a smaller diameter than the wire and the barb. Also, the barb may have a planar arrowhead structure or an "X" cross sectional biaxial structure. The biaxial structure comprising two flat planar arrowheads in a coaxial axis configuration that are 90° phase crossed.

In a second aspect, the present invention is directed to a method for bonding a wire to a semiconductor device having a top surface, the method comprising: inserting the wire within a hollow metal tube such that a portion of one end of the wire extends through the tube, the tube capable of structurally supporting the wire during subsequent thermal processing; heating the wire to a molten state to structurally modify the portion of one end of the wire; forming the portion of one end of the wire in the molten state into a barb pointed end; inserting the wire with the barb pointed end into and through a bond pad; and removing the tube. An alloy ball or bead may be formed at the portion of one end of the wire. The heating may be applied using a laser, a plasma process, or an electric arc. The step of forming the barb pointed end includes the portion of one end of the wire in the molten state extruding from the tube into a swage to shape the portion of one end of the wire into a barb pointed end. The step of forming the barb pointed end may also include facilitating dendrite growth on the portion of one end of the wire, applying an angled PVD deposition at the portion of one end of the wire, crimping the wire, or using a mold to form the portion of one end of the wire into a barb pointed end. An alloy material may be added to the alloy ball or bead for hardness when the alloy ball or bead is cooled. The alloy material may include nickel, copper alloy, tin alloy, or chromium alloy. The barb pointed end may be inserted within an underpad layer below the bond pad. The bond pad over the barb may be vacuum welded, causing electrical connection between the bond pad and the wire. A cushioning cavity may be formed within the underpad layer to absorb the barb pointed end. A metal pad layer may be formed under the bond pad.

In a third aspect, the present invention is directed to a method for inserting a barbed-end wire bond into a dielectric, comprising: forming a conductive plate over a dielectric base, the conductive plate having an opening larger than the wire bond without the barbed-end; inserting the barbed-end wire bond through the opening into the dielectric. The method includes coating the barbed-end wire bond with an alloying metal and applying heat after inserting the barbed-end wire bond to form an alloy with the conductive plate. The method also includes etching a cavity in the dielectric below the opening using an isotropic etch, the cavity made large enough to receive the barbed-end wire bond. An alloying metal may be deposited within the cavity, and applying a heat treatment to form an alloy. The alloying metal may be deposited by CVD, PVD, evaporation, or plating.

BRIEF DESCRIPTION OF THE DRAWINGS

The features of the invention believed to be novel and the elements characteristic of the invention are set forth with particularity in the appended claims. The figures are for illustration purposes only and are not drawn to scale. The invention itself, however, both as to organization and method of operation, may best be understood by reference to the detailed description which follows taken in conjunction with the accompanying drawings in which:

DESCRIPTION OF THE PREFERRED EMBODIMENT(S)

In describing the preferred embodiment of the present invention, reference will be made herein to FIGS. 1–9 of the drawings in which like numerals refer to like features of the invention.

The present invention provides a structure and method for protecting materials of semiconductor processing, such as low-k dielectric materials, from damage during wire bond operations.

A complimentary self-locking wire bond structure and technique is introduced, where the bonding force is focused at the tip of the bond wire and a barb-type construction is utilized to enhance the durability and reduce the insertion forces. The end of wire bond has an "arrowhead" or similar functioning fastener such that the force is focused to a point that pierces the bond pad in a local area. By applying highly focused force and pressure to a very small area, the barbed arrowhead helps avoid distortions and cracks that would otherwise incur in the bond pad and substrate. Moreover, the point of the arrowhead ensures insertion at a lower force and pressure than a non-barbed counterpart. Once the bond pad is made to cover the barbed wire bond, the arrowhead construction also increases the force to remove the wire bond from the bond pad as compared to the removal force of a non-barbed wire bond construction. Essentially, through its geometry, having a pointed front end and a flattened backend, the arrowhead barb hinders pullout.

Figure 1:
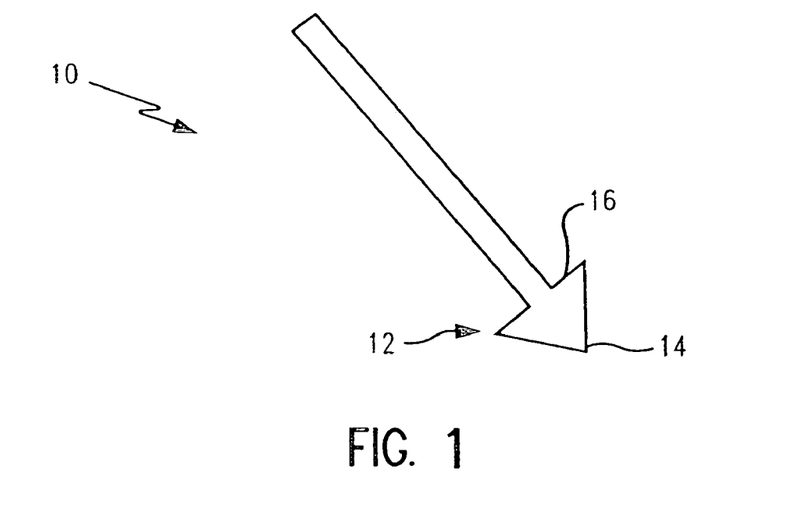
FIG. 1 depicts a wire bond of the present invention having a wire bond barb on its insertion end.

FIG. 1A depicts a first embodiment of the wire bond 10 of the present invention having a wire bond barb or arrowhead 12 on its insertion end. The arrowhead has a pointed end 14 for intrusion and a flattened backend portion 16. Although diameters and length of the arrowhead end will vary depending upon the size of the bulk wire use, the preferred embodiment will have a wire diameter of approximately 20 microns, an arrowhead extension of 15 microns in length, and an arrowhead base diameter of approximately 30 microns. Clearly, other dimensions are possible, and the preferred embodiment does not limit the use of other dimensions for particular applications. For example, the barbed end may vary in diameter from 5 to 75 microns, with a preferred diameter of 20 to 30 microns for optimum feasibility.

In a second embodiment, shown in FIG. 1B the arrowhead base diameter 100 may be less than the wire diameter 102. For example, a cylindrical wire having a diameter of 20 microns may be extended by a smaller cylindrical shaft 104, on the order of approximately 10 microns diameter and approximately 4 microns in length. The shaft is designed to be short enough not to break under pressure when piercing. The shaft extension extends to the arrowhead 106, which is of a lesser diameter than the wire, preferably about 18 microns at the base.

Although an arrowhead structure is described, any barb or multiple barb-type structure may be employed. For example, the arrowhead described above is in a cylindrical or conical dimension; however, it may also be a flat structure, such as the typical planar arrowhead or an "X" cross section biaxial arrowhead, which is not conical but two flat planar arrowheads in the same coaxial axis as the wire with a 90° phase crossed in the y-x and x-z planes.

Figure 2:
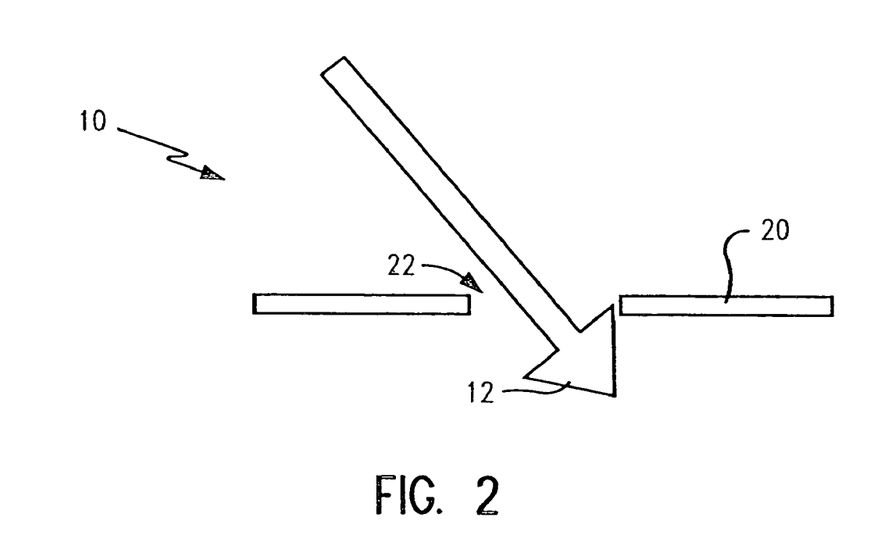
FIG. 2 depicts an inserted wire bond having a pointed arrowhead tip inserted into a bond pad.
Figure 3:
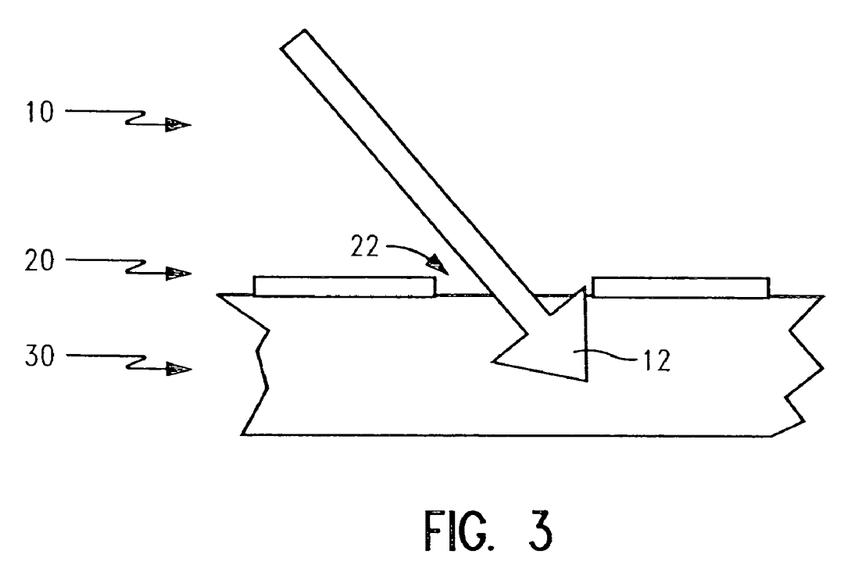
FIG. 3 depicts the wire bond of FIG. 2, showing a barbed end inserted through a bond pad and into an underpad layer.

In either embodiment, the wire bond is inserted into a bond pad using the barbed point as a means for reducing the insertion force. The bond pad, typically made of a conductive material, is electrically connected to the barbed wire after insertion. If desirable, the bond pad may be comprised of layers of different metals to enhance bonding characteristics. For example, a metal with an affinity for bonding to the semiconductor material forming the semiconductor device may be utilized. An intermediate layer may also be introduced on the bond pad to help prevent intermetallic compounds from forming. However, many of the bond pad materials exhibit little resilience to intrusions, which can leave a gap where the wider flattened backend portion 16 of the wire bond arrowhead has subsequently passed. FIG. 2 depicts an inserted wire bond 10 with arrowhead 12 inserted into a bond pad 20. A gap 22 in the bond pad surface results from the insertion of the barbed wire bond. Typically, the wire bond extorts in the pad but does not extort beyond the pad to the underpad layer. The pad may deform or even crack; however, in the preferred design, the energy is maintained in the pad pocket, i.e., cracks do not extend beyond the pad pocket, which could damage sensitive structures. FIG. 3 depicts the wire bond 10 of the present invention, showing a barbed end 12 inserted through a bond pad 20 and into an underpad layer 30. Again, a break or gap in the bond pad surface 22 is shown as a result of the barb-shaped wire bond end and its subsequent insertion.

Figure 4:
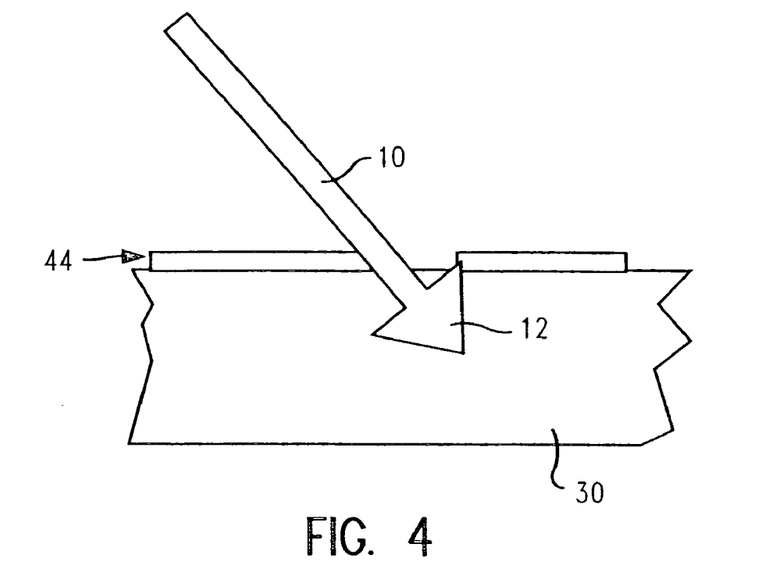
FIG. 4 depicts a wire bond with an arrowhead point inserted through a self-healing bond pad and into an underpad layer.

Importantly, the present invention allows for the bond pad to be self-healing. In this manner, the bond pad is made to close over and seal or lock the barb into the underpad layer below the pad, while making electrical contact with the wire bond at the bond pad surface. Preferably, the bond pad is formed from gold alloys, such that non-oxidized gold can rejoin under vacuum welding to connect the metal pad with the bond wire. Importantly, force need not be applied to the wire bond structure during welding. Other metals may also be vacuum welded to seal the barb into the bond pad. FIG. 4 depicts a wire bond 10 with an arrowhead point 12 inserted through a self-healing or vacuum welded bond pad 44 and into underpad layer 30.

Figure 5:
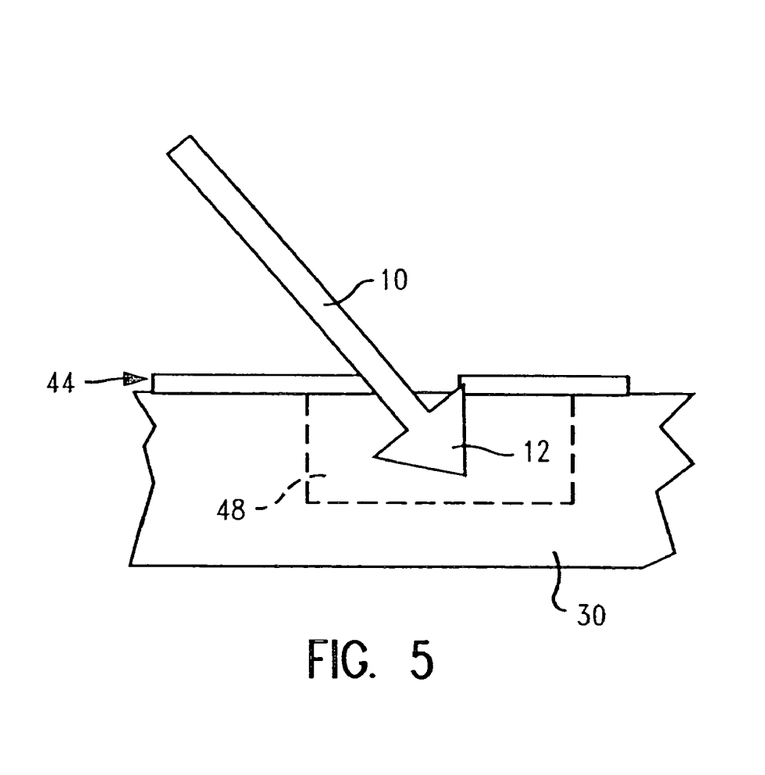
FIG. 5 depicts a wire bond with an arrowhead point inserted through a bond pad and into an underpad layer having a cushioning cavity therein.

Additionally, the bond pad may have a cushioning layer or cavity below it to dampen the piercing force of the pointed barb. This cushioning layer or cavity provides for the limitation and attenuation of the insertion force. It also provides an area for the barbed wire bond to insert and an appreciable retention force to lock the wire bond within the cavity, below the surface of the pad. Preferably, the cushioning layer is made of elastic material to self-seal and resist cracking. Typical coating processes may be used to apply the cushioning layer. The cushioning layer may be comprised of a polymer, such as SiLK®, or soft metals, such as lead. Porous metal structures may be used as long as the cracks remain within the confines of the structure. Frangible ceramic structures may also be used. The deformation within the ceramic structure will make it harder to pull out. An etch may be performed to create a cavity or pocket, which is then filled with an elastomer or polyimide. Spin-on organic compounds are preferred over harder materials. A cavity of cushioning material 48 is shown in FIG. 5. The cavity may also be filled with electro-conductive elastomer, which would assist electrical conduction with the wire.

Figure 6A:
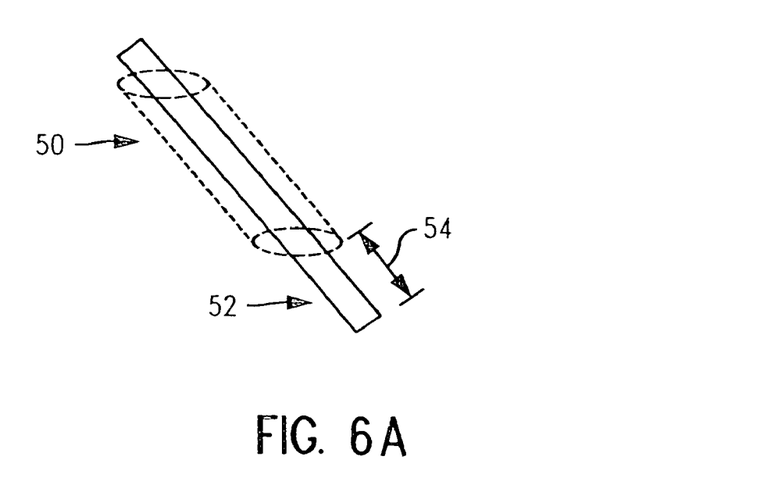
FIG. 6A depicts a hollow tungsten support tube with an extension of a wire extended therethrough for fabricating the barbed end.
Figure 6B:
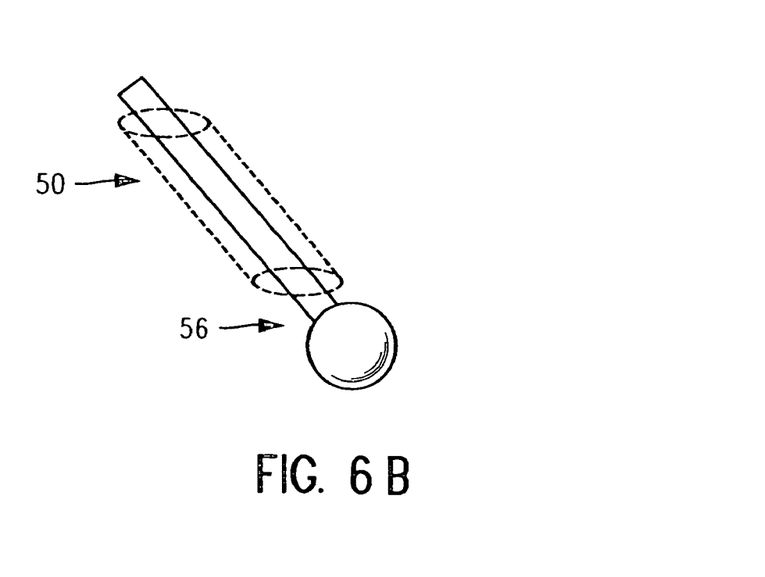
FIG. 6B depicts the end of the wire of FIG. 6A after rapid thermal exposure, forming an alloy ball or bead of wire material at the end of the wire.
Figure 6C:
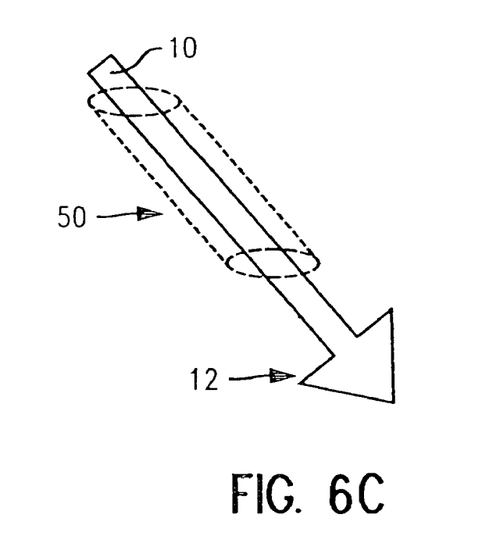
FIG. 6C depicts the wire bond of FIG. 6B with arrowhead point extruding from the support tube.

FIGS. 6A–6C depict the construction of a wire bond having a barbed end point. A hollow tungsten (W) tube is used to support the wire during this process. FIG. 6A depicts a hollow tungsten support tube 50 with an extension or run out of a wire 52 extended therethrough. A rapid thermal heat is applied to modify the alloy of the wire tip, which extends from the end of the tungsten tube. The tube itself protects the wire within from modifying under the heat stress. FIG. 6B depicts the end of the wire after rapid thermal exposure, forming an alloy ball or bead of wire material 56 at the end of the wire. Many thermal sources can be considered for this application; however, a laser, plasma, or electric arc is the preferred method of thermal induction. During the bead's molten state, an alloy material may be added for hardness, such as nickel, copper alloys, tin alloys, chromium alloys, and the like.

Figure 7A:
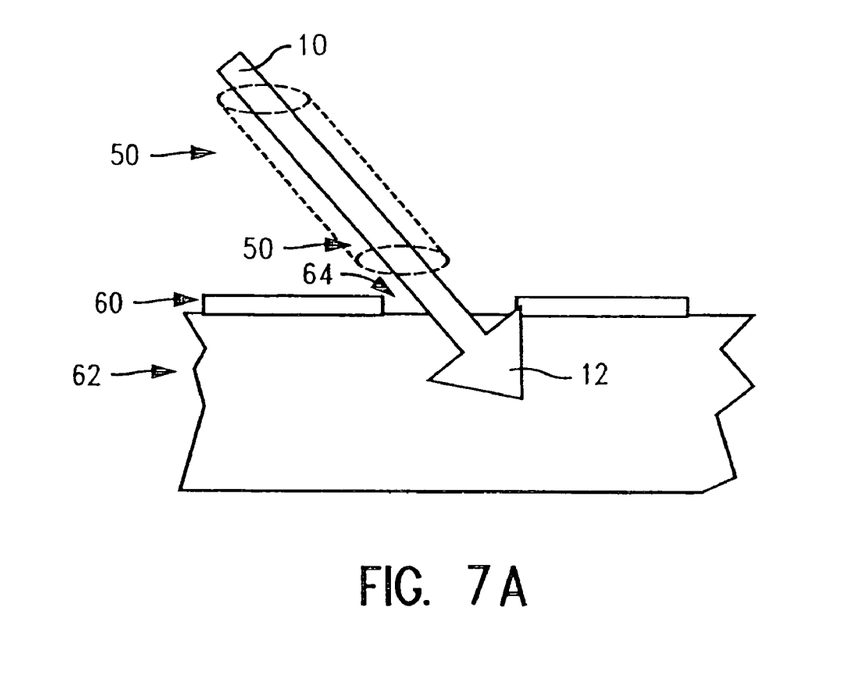
FIG. 7A depicts the wire bond of FIG. 6C with the arrowhead point inserted into a bond pad and underpad layer, having the tungsten tube still intact.
Figure 7B:
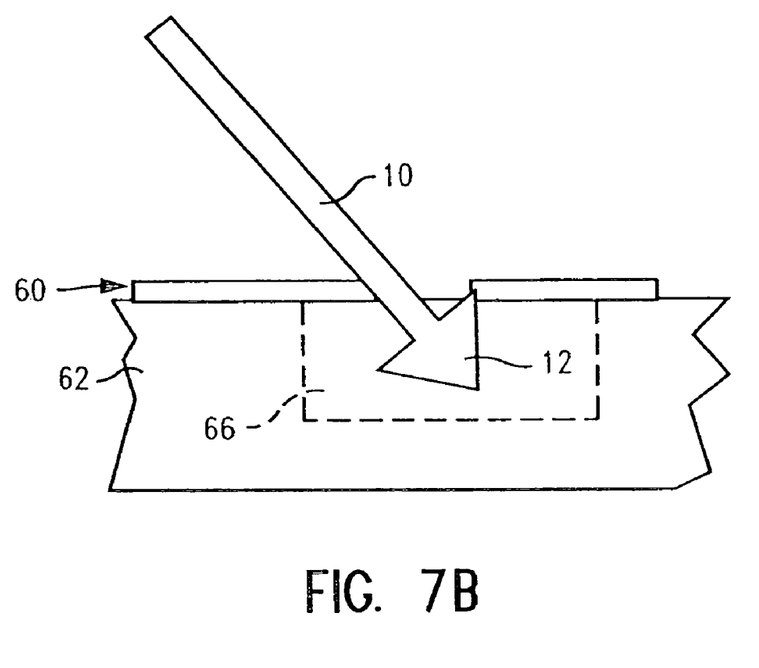
FIG. 7B depicts the wire bond after the support tube is withdrawn, and the bond pad is subsequently healed about the wire bond.

Driving the molten wire bead into a swage to shape the bead into a barb or arrowhead forms the barbed end point. A cold swage could also work as well. FIG. 6C depicts the wire bond 10 with arrowhead point 12 extruding from the support tube 50. The alloy tip will resist deformation during insertion while the tungsten tube supports the wire from bending. FIG. 7A depicts the wire bond 10 with arrowhead point 12 inserted into a bond pad 60 and underpad layer 62, with the tungsten tube 50 still intact. As noted in FIG. 7A, a gap 64 may be present in the bond pad 60 unless the bond pad is a self-healing pad as discussed above. The tungsten tube 50 is then withdrawn, leaving the wire bond intact with the bond pad. FIG. 7B depicts the wire bond after the support tube is withdrawn, and the bond pad is subsequently healed about the wire bond. As previously noted, a cushioning cavity 66 may be fabricated within the underpad layer to disperse insertion forces.

Figure 8A:
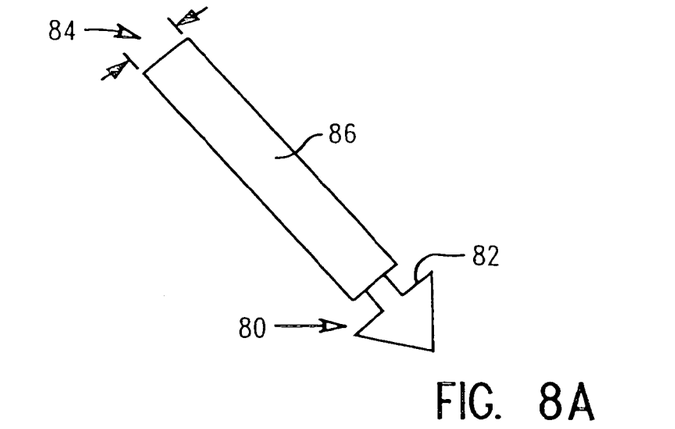
FIG. 8A depicts a barbed wire construction where the barbed end is within the diameter of the bulk wire.
Figure 8B:
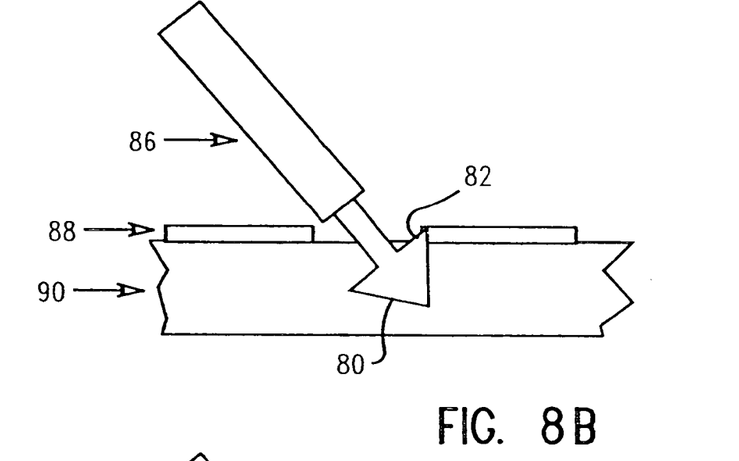
FIG. 8B depicts the barbed wire bond wire of FIG. 8A inserted through a bond pad and underpad layer for a non-healing bond pad.
Figure 8C:
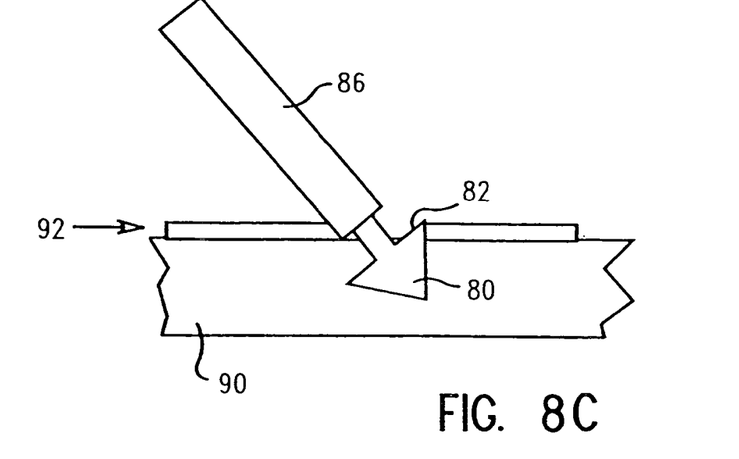
FIG. 8C depicts the barbed wire bond wire of FIG. 8A inserted through a bond pad and underpad layer for a self-healing bond pad.

A swage type compressing process may also be used to form the tip of the bond wire into a rebated barbed wire bond, where the diameter of the wide end does not extend beyond the diameter of the bulk wire. For example, the wire may be crimped to form the barbed end. FIG. 8A depicts a barbed wire construction with the rebated barbed wire bond within the diameter of the bulk wire. As indicated, the barbed end 80 has a wider, flattened backend 82 that has a diameter equal to or less then the diameter 84 of the bulk wire 86. FIGS. 8B and 8C depict the barbed wire bond wire inserted through a bond pad and underpad layer 90 for both non-healing 88 and self-healing 92 bond pads, respectively. Alloy materials may be utilized to increase the strength and hardness of this structure.

Figure 9:
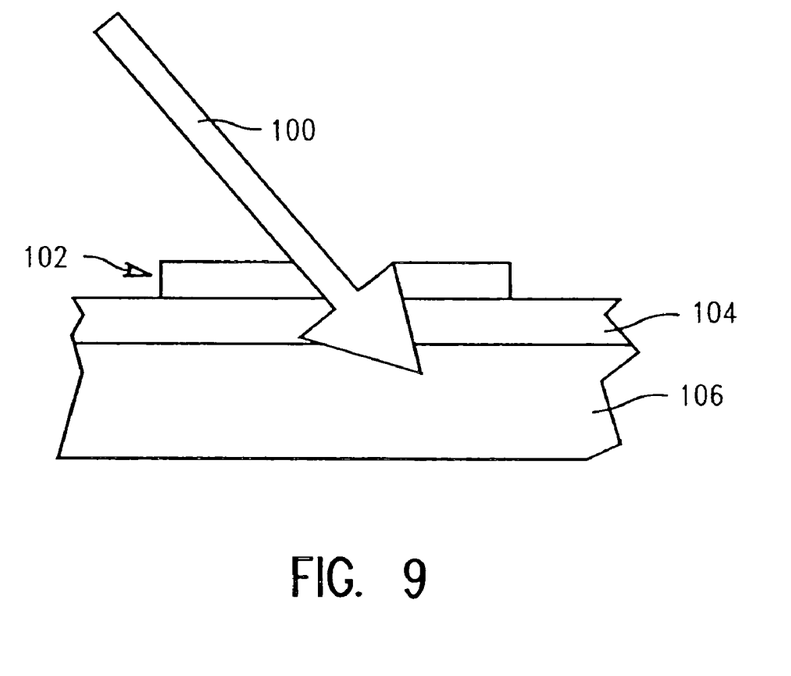
FIG. 9 depicts a barb-shaped wire bond inserted into a bond pad, a thin metal pad, and an underpad layer.

Another method to minimize the barb deformation during insertion through the pad is to provide a thin metal pad over the compliant underpad layer. FIG. 9 depicts a barb-shaped wire bond 100 inserted into a bond pad 102, a thin metal pad 104, and an underpad layer 106. The thickness of the thin metal pad 104 may be determined by current and electromigration requirements necessary for its deposition.

Other possibilities for constructing an arrowhead shaped wire bond endpoint include the facilitation of dendrite growth on the tip of the wire, an angled PVD deposition at the tip of the wire, or using a mold to form the wire in an arrowhead or barb-shaped geometry. Note that the resistivity of the barb tip is not a necessary requirement since it penetrates below the pad. The current is carried in the wire, which is electrically connected to the bond pad itself.

Yet another method for minimizing barb deformation includes constructing a porous metal bond pad. This can be accomplished by a wet etch, especially if the pad is a two-phase alloy, such as aluminum-copper (Al—Cu) with 50—50 composition. The pad is then etched to remove one of the metals. Etch masks may also be utilized based on processes discussed above, such as dendrite growth on the bond pad, or an angled PVD deposition to promote a selective etching of the pad.

Figure 10A:
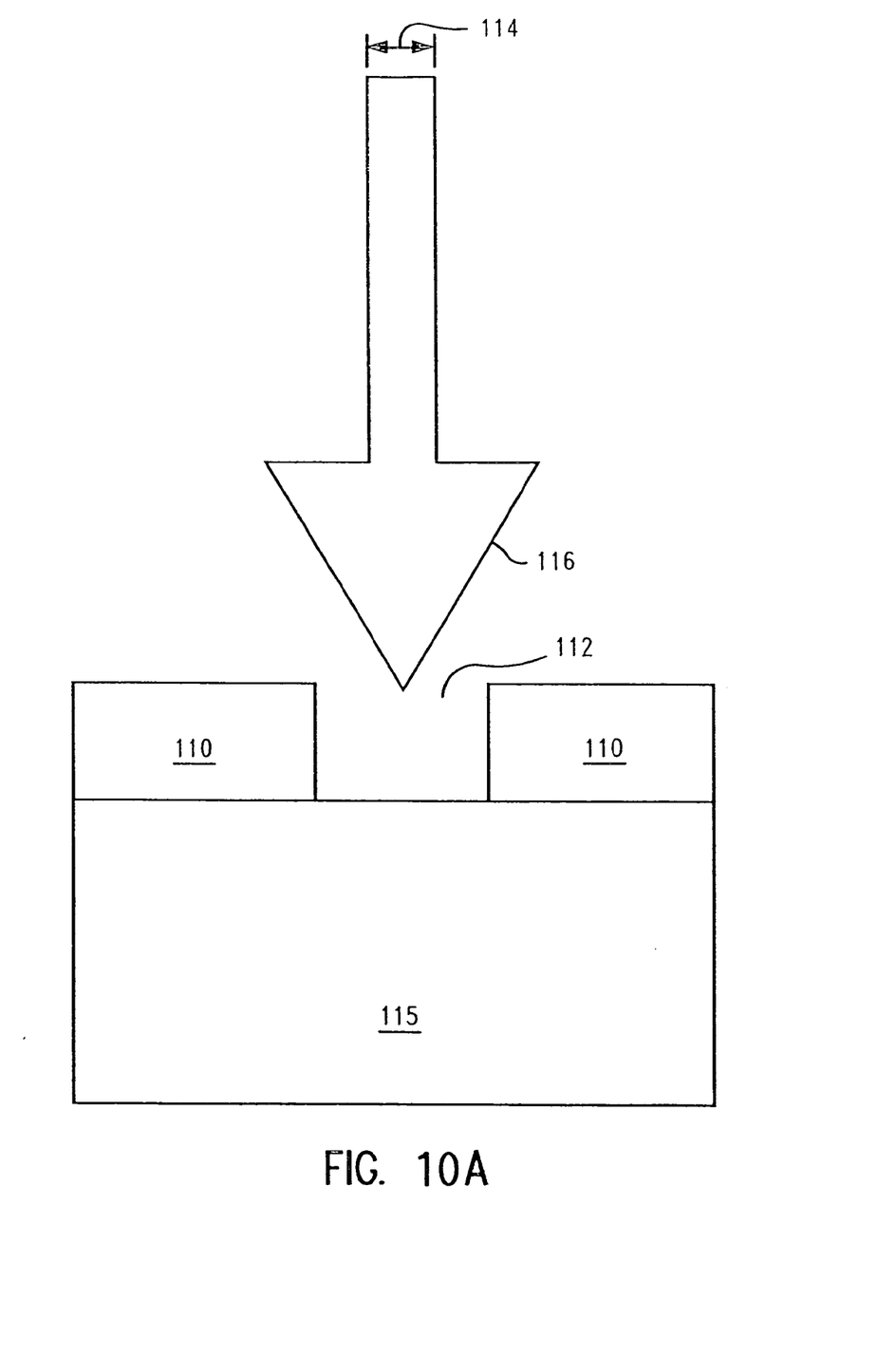
FIG. 10A depicts a barb-shaped wire bond inserted into a conductive plate designed with an opening slightly larger than the width or diameter of the wire bond wire without a barbed-end.
Figure 10B:
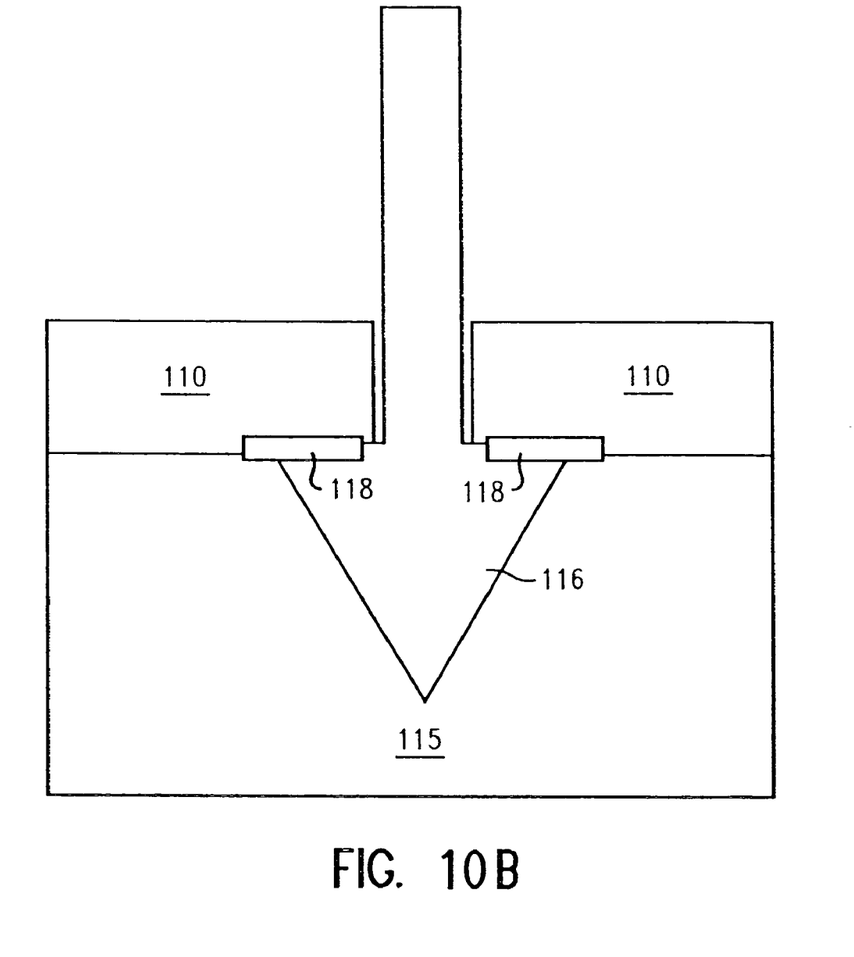
FIG. 10B depicts the barb-shaped wire bond of FIG. 10A with an alloy metal coating.

In another embodiment, depicted in FIG. 10A, a conductive plate 110 is designed with an opening 112, which is slightly larger than the width or diameter of the wire bond wire 114 without a barb. Using the methods described above, the arrowhead or barb 116 is inserted through opening 112 into a dielectric, preferably a soft dielectric 115, such as SiLK®. To improve the adhesion of the barb bond, the barb 116 may be coated with an alloying metal so that, with appropriate heat treatment an alloy 118 forms, as depicted in FIG. 10B.

Figure 11:
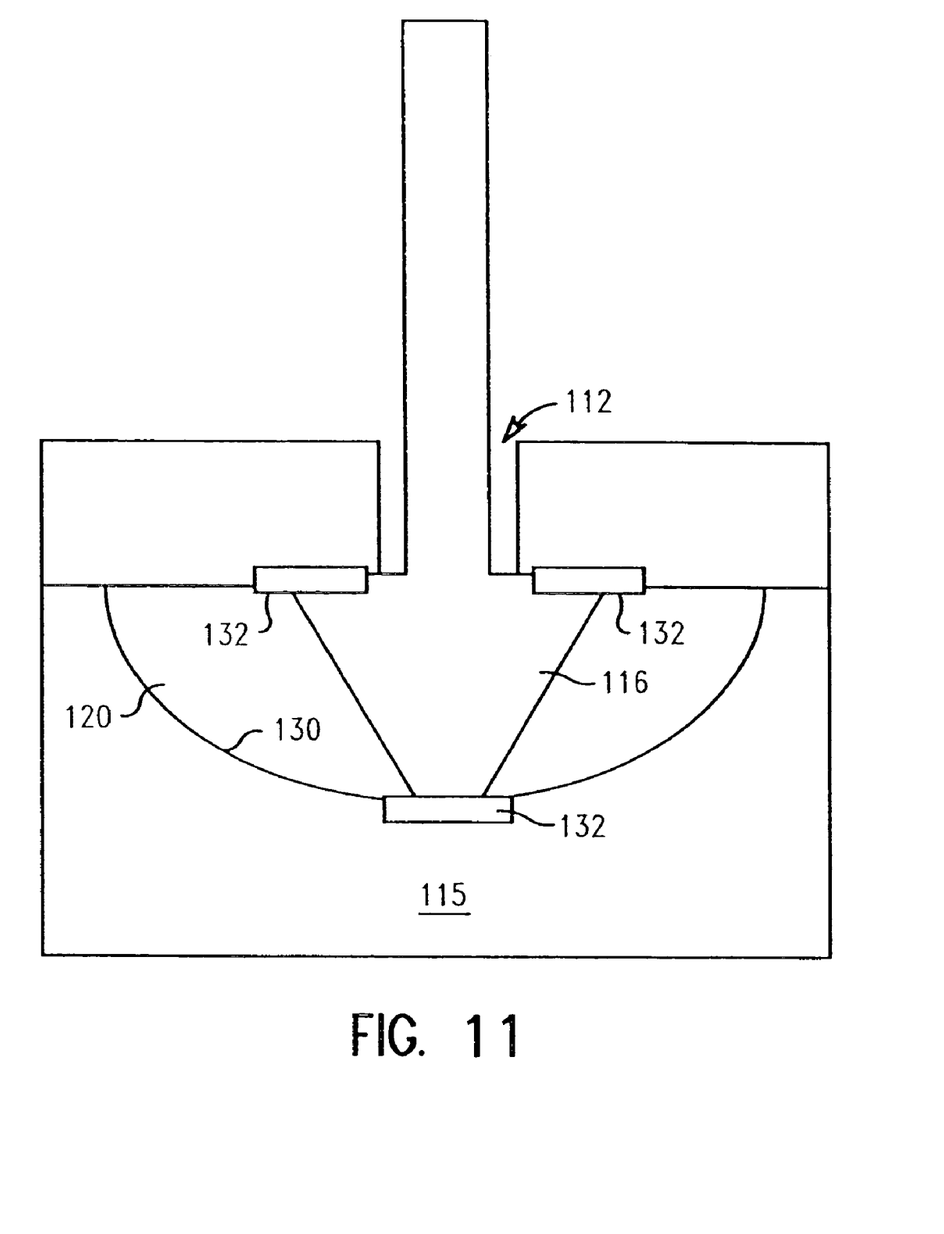
FIG. 11 depicts a cavity formed by an isotropic etch within the dielectric base to receive the barbed-end wire bond.

A space or cavity made to accept the barbed-end may be formed in the dielectric below the opening 112 in the plate 110 by an etching process. FIG. 11 depicts a cavity 120 formed by an isotropic etch. This opening would facilitate the insertion of the arrowhead wire bond. Additionally, after the etched was performed, the inside of the cavity 120 may be lined with an alloy metal 130 using any known deposition method, including, but not limited to CVD, PVD, evaporation, or plating. After insertion of the arrowhead wire bond, a heat treatment may then be used to form an alloy 132, which would improve the adhesion of the wire bond.

While the present invention has been particularly described, in conjunction with a specific preferred embodiment, it is evident that many alternatives, modifications and variations will be apparent to those skilled in the art in light of the foregoing description. It is therefore contemplated that the appended claims will embrace any such alternatives, modifications and variations as falling within the true scope and spirit of the present invention.

Thus, having described the invention, what is claimed is:

1. A method for bonding a wire to a semiconductor device having a top surface, said method comprising:
   inserting said wire within a hollow metal tube such that a portion of one end of said wire extends through said tube, said tube capable of structurally supporting said wire during subsequent thermal processing;
   heating said wire to a molten state to structurally modify said portion of one end of said wire;
   forming said portion of one end of said wire in said molten state into a barb pointed end;
   inserting said wire with said barb pointed end into and through a bond pad; and
   removing said tube.

2. The method of claim 1 further including forming an alloy ball or bead at said portion of one end of said wire.

3. The method of claim 1 wherein said step of forming said barb pointed end includes said portion of one end of said wire in said molten state extruding from said tube into a swage to shape said portion of one end of said wire into a barb pointed end.

4. The method of claim 1 wherein said step of forming said barb pointed end includes facilitating dendrite growth on said portion of one end of said wire, applying an angled PVD deposition at said portion of one end of said wire, crimping said wire, or using a mold to form said portion of one end of said wire into a barb pointed end.

5. The method of claim 2 including adding an alloy material to said alloy ball or bead for hardness when said alloy ball or bead is cooled.

6. The method of claim 5 wherein said alloy material comprises nickel, copper alloy, tin alloy, or chromium alloy.

7. The method of claim 1 further comprising inserting said barb pointed end within an underpad layer below said bond pad.

8. The method of claim 1 including forming a thin metal pad layer under said bond pad.

9. A wire bond apparatus for bonding wires to a semiconductor device having a top surface, said apparatus comprising:
   a wire having a barb at one end;
   a shaft between said barb and said wire, said shaft of a smaller diameter than said wire and said barb;
   a bond pad on said top surface of said semiconductor device; and
   an underpad layer beneath said bond pad to receive said barb inserted through said bond pad.

10. A wire bond apparatus for bonding wires to a semiconductor device having a top surface, said apparatus comprising:
    a wire having a barb at one end, said barb having a planar arrowhead structure or an "X" cross sectional biaxial structure;
    a bond pad on said top surface of said semiconductor device; and
    an underpad layer beneath said bond pad to receive said barb inserted through said bond pad.

11. The apparatus of claim 10 further including having said biaxial structure comprise two flat planar arrowheads in a coaxial axis configuration that are 90° phase crossed.

12. A method for inserting a barbed-end wire bond into a dielectric, comprising:
    forming a conductive plate over a dielectric base, said conductive plate having an opening larger than said wire bond without said barbed-end;
    inserting said barbed-end wire bond through said opening into said dielectric.

* * * * *